(12) United States Patent
Park et al.

(10) Patent No.: US 11,359,277 B2
(45) Date of Patent: Jun. 14, 2022

(54) MASKING BLOCK THAT IS CONFIGURED IN A PATTERN FOR DIRECT SYNTHESIS OF A TWO-DIMENSIONAL MATERIAL HAVING THE PATTERN ON A GROWTH SUBSTRATE AND THAT IS EASILY BONDABLE TO AND DEBONDABLE FROM THE GROWTH SUBSTRATE

(71) Applicant: KOREA INSTITUTE OF SCIENCE AND TECHNOLOGY, Seoul (KR)

(72) Inventors: Jaehyun Park, Seoul (KR); Dongjun Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 16/880,432

(22) Filed: May 21, 2020

(65) Prior Publication Data
US 2021/0164096 A1 Jun. 3, 2021

(30) Foreign Application Priority Data

Nov. 28, 2019 (KR) .......................... 10-2019-0155421

(51) Int. Cl.
*C23C 16/34* (2006.01)
*C23C 16/04* (2006.01)
(Continued)

(52) U.S. Cl.
CPC ........ *C23C 16/342* (2013.01); *C23C 16/0209* (2013.01); *C23C 16/0254* (2013.01);
(Continued)

(58) Field of Classification Search
CPC .......................... C23C 16/342; C23C 16/042
See application file for complete search history.

(56) References Cited

U.S. PATENT DOCUMENTS 10,629,696 B1 * 4/2020 Park .................. H01L 21/02488

FOREIGN PATENT DOCUMENTS

| KR | 1020140052517 A | 5/2014 |
|----|-----------------|--------|
| KR | 1020160012804 A | 2/2016 |

(Continued)

OTHER PUBLICATIONS

Machine translation by Google Patents of KR20140052517, published May 7, 2014. (Year: 2014).*
(Continued)

*Primary Examiner* — Monique R Jackson
(74) *Attorney, Agent, or Firm* — Rabin & Berdo, P.C.

(57) ABSTRACT

A masking block configured to contact a growth substrate to define a pattern of a two-dimensional material directly synthesized on the growth substrate, includes a base substrate; a gamma-alumina film that is disposed on the base substrate and that has an upper surface in which a (110) plane is dominant as being more than 50%; and a hexagonal boron nitride film that is doped with carbon and oxygen that is disposed on the gamma-alumina film, and that has reduced defects due to properties of the gamma-alumina film, wherein the hexagonal boron nitride film contains an amount of carbon ranging from 1 at % to 15 at % based on total atoms of carbon, oxygen, nitrogen and boron in the hexagonal boron nitride film and includes voids such that a coverage ratio of the hexagonal boron nitride film on the gamma-alumina film is less than 1 and equal to or more than 0.9.

10 Claims, 11 Drawing Sheets

(51) Int. Cl.
*C23C 16/02* (2006.01)
*C23C 16/455* (2006.01)

(52) U.S. Cl.
CPC ........ *C23C 16/042* (2013.01); *C23C 16/0227* (2013.01); *C23C 16/45525* (2013.01)

(56) References Cited

FOREIGN PATENT DOCUMENTS

| KR | 101901596 B1 | 9/2018 |
| KR | 102072580 B1 | 2/2020 |
| KR | 1020200054655 A | 5/2020 |

OTHER PUBLICATIONS

Kumar, First principles guide to tune h-BN nanostructures as superior light-element-based hydrogen storage materials: role of the bond exchange spillover mechanism, 2015, Journal of Materials Chemistry A, Vo. 3, pp. 304-313, and Supplementary Information pp. 1-7. (Year: 2015).*

Uddin, Layer-structured hexagonal (BN)C semiconductor alloys with tunable optical and electrical properties, 2014, Journal of Applied Physics 115, 093509. (Year: 2014).*

Gao, Long Range Functionalization of h-BN Monolayer by Carbon Doping, 2016, The Journal of Physical Chemistry C, 120, pp. 15993-16001. (Year: 2016).*

Grenadier, Origin and roles of oxygen impurities in hexagonal boron nitride epilayers, 2018, Appl. Phys. Lett. 112, 162103. (Year: 2018).*

Busca, The surface of transitional aluminas: A critical review, 2014, Catalysis Today, vol. 226, pp. 2-13. (Year: 2014).*

Ferreira, Structural models of activated γ-alumina surfaces revisited: Thermodynamics, NMR and IR spectroscopies from ab initio calculations, 2013, Chemical Physics, vol. 423, pp. 62-72. (Year: 2013).*

Chen, Surface interaction model of γ-alumina-supported metal oxides, 1992, Catalysis Letters 2, pp. 51-62. (Year: 1992).*

Reller, High Resolution Transmission Electron Microscopic (HRTEM) Determination of the Preferentially Exposed Faces on γ-$Al_2O_3$ and η-$Al_2O_3$, 1989, Catalysis Letters 2, pp. 91-96. (Year: 1989).*

* cited by examiner

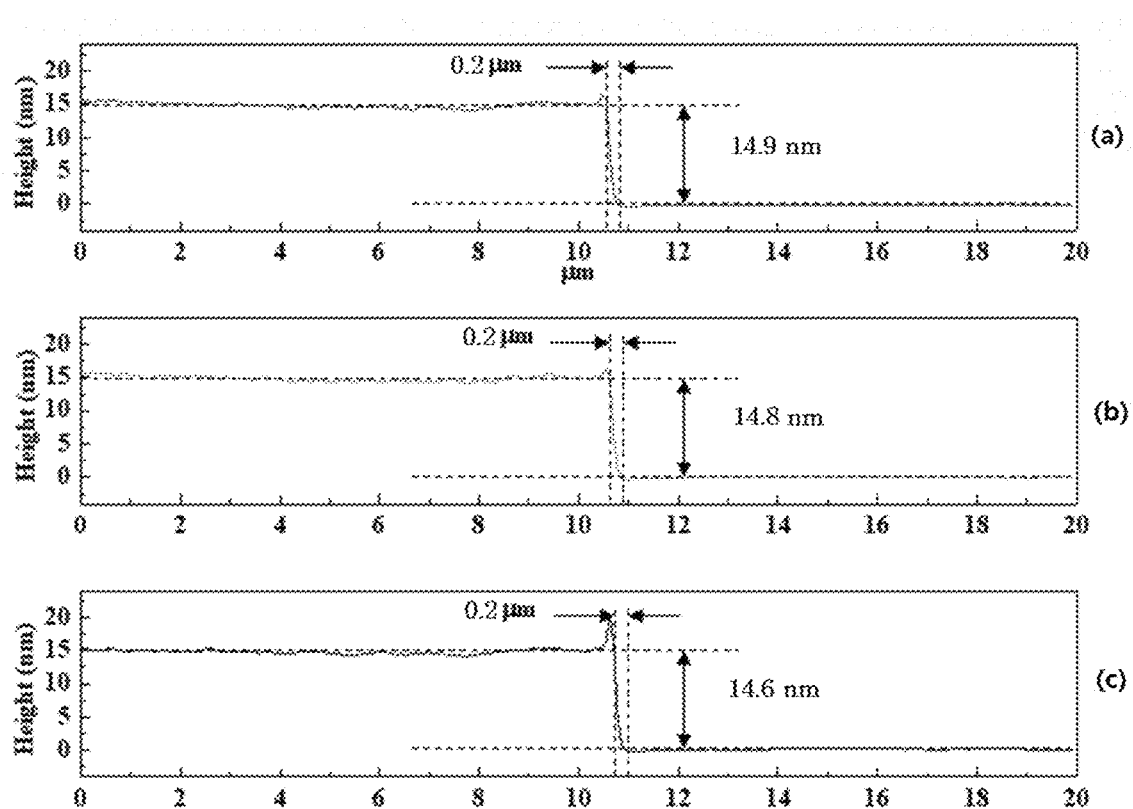

MASKING BLOCK THAT IS CONFIGURED IN A PATTERN FOR DIRECT SYNTHESIS OF A TWO-DIMENSIONAL MATERIAL HAVING THE PATTERN ON A GROWTH SUBSTRATE AND THAT IS EASILY BONDABLE TO AND DEBONDABLE FROM THE GROWTH SUBSTRATE

CROSS-REFERENCE TO RELATED APPLICATIONS

This application claims priority under 35 U.S.C. § 119 to Korean Patent Application No. 10-2019-0155421, filed on Nov. 28, 2019, and all the benefits accruing therefrom, the content of which is herein incorporated by reference in its entirety.

BACKGROUND

1. Field

Exemplary embodiments relate to a method for forming a pattern. More particularly, exemplary embodiments relate to a masking block that is easily bondable and debondable, a method for manufacturing a masking block and a method for forming a pattern of two-dimensional material using the masking block.

2. Description of the Related Art

Graphene is a two-dimensional material having a high carrier mobility and an optical anisotropy, and can be used for an electronic device, an electro-optical device or the like. Thus, research and development for graphene are being actively conducted.

One of important technical solutions for implementing intrinsic performance of graphene is forming a graphene thin film having a high quality. Furthermore, in order to use graphene for an optical device such as an electro-optical device, defects in graphene needs to be extremely inhibited or precisely controlled. However, a conventional method for patterning graphene includes an etching process or a transferring process. Thus, graphene may be easily contaminated, and manufacturing efficiency is low.

In order to solve the above problems, the applicant has suggested a direct synthesizing method for a two-dimensional material pattern using a catalyst block through Korean Patent Application Nos. 2018-0138211 and 2018-0134962.

SUMMARY

Exemplary embodiments provide a masking block that is easily bondable and debondable to a bulk material substrate.

Exemplary embodiments provide a method for manufacturing the masking block.

Exemplary embodiments provide a method for forming a pattern of two-dimensional material using the masking block.

According to an exemplary embodiment, a masking block includes a base substrate, a gamma-alumina thin film disposed on the base substrate, and a hexagonal boron nitride thin film doped with carbon and oxygen and disposed on the gamma-alumina thin film. An amount of carbon in the hexagonal boron nitride thin film is 1 at % to 15 at %.

In an exemplary embodiment, an amount of oxygen in the hexagonal boron nitride thin film is 1 at % to 10 at %.

In an exemplary embodiment, an amount of oxygen in the hexagonal boron nitride thin film is 1 at % to 10 at %.

In an exemplary embodiment, a coverage of the hexagonal boron nitride thin film on the gamma-alumina thin film is less than 1.

In an exemplary embodiment, the coverage of the hexagonal boron nitride thin film on the gamma-alumina thin film is equal to or more than 0.9.

In an exemplary embodiment, a thickness of the hexagonal boron nitride thin film is equal to or less than 1 nm.

According to an exemplary embodiment, a method for forming a pattern is provided. According to the method, a masking block is pressed on a growth substrate to adhere the masking block to the growth substrate. A source material is provided to the growth substrate to form a pattern of a two-dimensional material. The masking block is debonded from the growth substrate.

In an exemplary embodiment, the two-dimensional material includes graphene, and the pattern is formed selectively at a contact interface between the masking block and the growth substrate.

In an exemplary embodiment, the pattern including graphene is synthesized in an atmosphere including a carbon source and an oxygen-containing material.

In an exemplary embodiment, the two-dimensional material includes hexagonal boron nitride or a transitional metal dichalcogenide, and the pattern is formed selectively on an exposed surface of the growth substrate, which is not adhered to the masking block.

According to an exemplary embodiment, a method for manufacturing a masking block is provided. According to the method, an amorphous alumina thin film is formed on a base substrate. The amorphous alumina thin film is heated to form a gamma-alumina thin film. A hexagonal boron nitride thin film doped with carbon and oxygen is formed on the gamma-alumina thin film. An amount of carbon in the hexagonal boron nitride thin film is 1 at % to 15 at %. A thickness of the gamma-alumina thin film may be 5 nm to 10 nm.

According to the exemplary embodiments, a masking block having a hybrid configuration of gamma-alumina and h-BN is used for directly synthesizing a pattern of a two-dimensional material. Thus, slip of the masking block may be prevented, and the masking block may be stably bonded to a growth substrate in the process of synthesizing the pattern. Thus, it may be prevented that the pattern is transcribed or moved and that the pattern or the growth substrate is damaged. Thus, reliability of directly synthesizing a pattern of a two-dimensional material may be remarkably improved.

BRIEF DESCRIPTION OF THE DRAWINGS

The above and other features and advantages will become more apparent by describing exemplary embodiments thereof with reference to the accompanying drawings, in which:

FIG. 5B is a graph showing a result of measuring a surface height of the growth substrate and the h-BN thin film pattern directly formed on the growth substrate by using the masking block of Example 1.

DETAILED DESCRIPTION

Figure 1A:
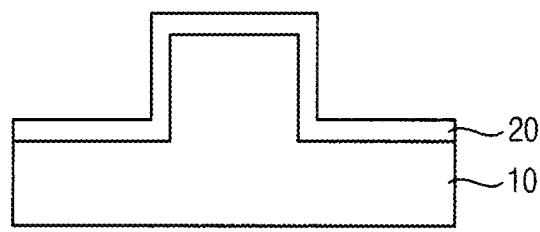
FIGS. 1A to 1C are cross-sectional views illustrating a method for manufacturing a masking block according to an exemplary embodiment.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method for Forming a Masking Block

Figure 1B:
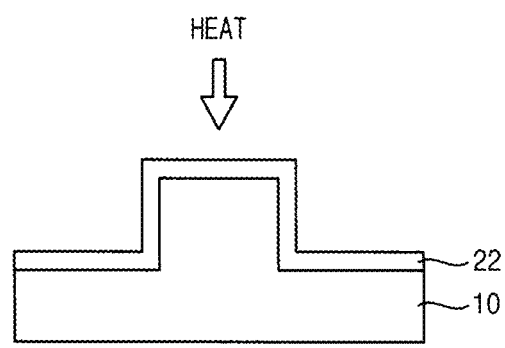
Figure 1C:
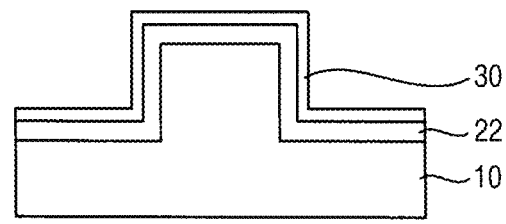

FIGS. 1A to 1C are cross-sectional views illustrating a method for manufacturing a masking block according to an exemplary embodiment.

Referring to FIGS. 1A and 1B, an amorphous alumina thin film 20 is formed on a base substrate 10, and heated to form a gamma-alumina ($\gamma$-$Al_2O_3$) thin film 22.

For example, the base substrate 10 may include silicon, silicon oxide, glass or the like. In an exemplary embodiment, the base substrate 10 may have a protrusion that protrudes upwardly. However, exemplary embodiments are not limited thereto. For example, the base substrate 10 may have a plate shape, a polyhedron shape or the like. Furthermore, the base substrate 10 may have an opening.

For example, the amorphous alumina thin film 20 may be formed through a deposition process such atom layer deposition (ALD) or the like. The amorphous alumina thin film 20 may be heated to form the gamma-alumina thin film 22 that is crystalline.

For example, an aluminum precursor and an oxygen source may be provided to form the amorphous alumina thin film 20 through ALD. For example, the aluminum precursor may include trimethyl aluminum ((CH3)3Al, TMA), aluminum isoproxide, ([Al(OC3H7)3], IPA), methyl-pyrolidine-tri-methyl aluminum (MPTMA), ethyl-pyridinetriethyl-aluminum (EPPTEA) ethyl-pyridine-dimethyl-aluminumhydridge (EPPDMAH), AlCH3 or a combination thereof. The oxygen source may include $O_3$, $H_2O$ or a combination thereof.

The gamma-alumina thin film 22 may have a single-crystalline phase or a poly-crystalline phase.

Gamma-alumina has a defect spinel structure at a surface thereof. The defect spinel structure of gamma-alumina includes an aluminum tri-coordination ($Al_{III}$) site. The aluminum tri-coordination site is not stable. Thus, when a precursor such as borazine is adsorbed on a surface of the gamma-alumina thin film 22, the aluminum tri-coordination site reduces an activation barrier for dehydrogenation thereby functioning as a catalyst. Thus, hexagonal boron nitride (h-BN) may be synthesized at a relatively low temperature.

Furthermore, gamma-alumina has a small lattice mismatch to h-BN. Thus, defects caused by a lattice mismatch or strain therefrom may be effectively inhibited. Thus, an h-BN thin film may be formed through epitaxial-like growth. Therefore, an h-BN thin film having a high quality with inhibited defects may be formed.

In an exemplary embodiment, (110) plane may be dominant at an upper surface of the gamma-alumina thin film 22. For example, (110) plane may be more than 50% at an upper surface of the gamma-alumina thin film 22. For example, sum of (110) plane and (111) plane may be equal to or more than 99%.

For example, the root mean square roughness of the gamma-alumina thin film 22 may be equal to or less than 1 nm, and may be preferably equal to or less than 0.5 nm. When the root mean square roughness of the gamma-alumina thin film 22 is excessively large, defects may be increased in the h-BN thin film formed on the gamma-alumina thin film 22.

For example, the thickness of the gamma-alumina thin film 22 may be equal to or less than 100 nm, preferably 5 nm to 50 nm. When the thickness of the gamma-alumina thin film 22 is excessively large, a catalyst characteristic or a thermal stability of the gamma-alumina thin film 22 may be deteriorated. Furthermore, defects such as wrinkles may be formed in the h-BN thin film due to difference between thermal expansion efficiencies of the gamma-alumina thin film 22 and the h-BN thin film formed on the gamma-alumina thin film 22. When the thickness of the gamma-alumina thin film 22 is excessively small, the base substrate 10 may swell by oxidation of silicon due to leakage of a deposition system or the like. Thus, an adhesion force between the masking block and a growth substrate may be reduced when the masking block is adhered to the growth substrate.

For example, a crystallization process using a heat treatment may be performed at about 500° C. to 1,450° C. for at least 1 minute.

The crystallization process using a heat treatment may be omitted. For example, a deposition temperature in a chemical vaporization deposition (CVD) process and an ALD process may be controlled, or a molecular beam epitaxy (MBE) growth may be performed to form a gamma-alumina thin film without an individual heat treatment process.

Referring to FIG. 1C, an h-BN thin film 30 is formed on the gamma-alumina thin film 22.

For example, the h-BN thin film 30 may be formed by deposition. For example, the h-BN thin film 30 may be formed by various deposition methods including CVD.

In an exemplary embodiment, a growth temperature of the h-BN thin film 30 may be equal to or less than about 1,200° C. Preferably, the growth temperature of the h-BN thin film 30 may be equal to or less than about 750° C. The h-BN thin film 30 having a structure of a mono-layer or bi-layer may be formed through surface limited growth at equal to or less than about 750° C.

For example, the growth temperature of the h-BN thin film 30 may be about 100° C. to 750° C. When the growth temperature is excessively low, a growth rate of the h-BN thin film 30 may be excessively reduced, or defects in h-BN thin film 30 may be increased. Furthermore, when formed on the gamma-alumina thin film 22, the h-BN thin film 30 may be synthesized at a temperature lower than when formed on an amorphous alumina thin film.

For example, borazine ($N_3B_3H_6$) may be used as a source for forming the h-BN thin film 30. Borazine may be dehydrogenated thereby forming h-BN. In another exemplary embodiment, a nitrogen source and a boron source may be separately provided. For example, borane such as $BH_3$ may be used as a boron source, and ammonia may be used as a nitrogen source. Furthermore, hydrogen gas ($H_2$) may be added for adjusting flux of the source gas or for reducing the growth temperature. An inert gas such as argon may be used as a carrier gas. Furthermore, a carbon source such as methane may be added for carbon-doping.

In another exemplary embodiment, the h-BN thin film 30 may be formed on an amorphous alumina thin film. The amorphous alumina thin film may be crystallized by heat in the CVD process for forming the h-BN thin film 30 thereby forming the gamma-alumina thin film 22. However, forming the h-BN thin film 30 on the gamma-alumina thin film 22 may be preferred to reduce defects of the h-BN thin film 30.

In an exemplary embodiment, the h-BN thin film 30 may be doped with carbon and oxygen. For examples, nitrogen atoms may be partially replaced by carbon atoms. The carbon atoms may form a sp2 bonding, or may be combined with an oxygen atom to form a carboxyl group or a ketone group. The carboxyl group or the ketone group may be chemically bonded to the gamma-alumina thin film 22 so that a bonding force between the gamma-alumina thin film 22 and the h-BN thin film 30 may be increased. Thus, when the masking block is used for a method of forming a pattern, which will be explained, it may be prevented that the h-BN thin film 30 is separated from the gamma-alumina thin film 22 and moved to a growth substrate. When contents of carbon and oxygen are excessively large, a bonding force between the masking block and the growth substrate may be excessively increased so that the masking block may be hardly separated.

For example, a content of carbon in the h-BN thin film 30 may be 1 at % to 15 at %, and a content of oxygen in the h-BN thin film 30 may be 1 at % to 10 at %.

In an exemplary embodiment, the h-BN thin film 30 may include voids. For example, coverage of the h-BN thin film 30 on the gamma-alumina thin film 22 may be equal to or more than 0.9 and less than 1. When the h-BN thin film 30 fully covers the gamma-alumina thin film 22, for example, the coverage of the h-BN thin film 30 on the gamma-alumina thin film 22 is equal to or more than 1, grain boundaries of the h-BN thin film 30 are reduced so that defects by carbon and oxygen may be reduced. Thus, a bonding force between the gamma-alumina thin film 22 and the h-BN thin film 30 may be decreased. Thus, after a pattern is formed by using the masking block, when the masking block is separated from a growth substrate, the h-BN thin film 30 may be partially transcribed and moved to the growth substrate.

Preferably, the h-BN thin film 30 may have a thickness of a mono-layer or a bi-layer. For example, a thickness of the h-BN thin film 30 may be equal to or less than 1 nm, and may be preferably equal to or less than 0.8 nm. When a thickness of the h-BN thin film 30 is increased, a distance between the gamma-alumina thin film 22 and a growth substrate is increased as well when the masking block is used for forming a pattern on the growth substrate. Thus, when a thickness of the h-BN thin film 30 is excessively large, an adhesion force between the masking block and the growth substrate may be weak thereby causing slip between the masking block and the growth substrate.

Method for Forming a Pattern of a Two-Dimensional Material

FIGS. 2A to 2F are cross-sectional views illustrating a method for forming a pattern of a two-dimensional material according to an exemplary embodiment.

Figure 2A:
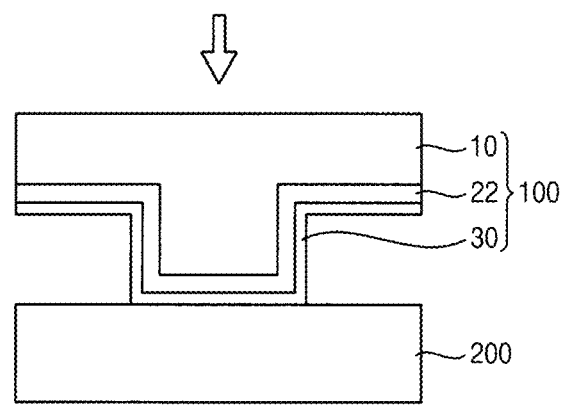
FIGS. 2A to 2F are cross-sectional views illustrating a method for forming a pattern of a two-dimensional material according to an exemplary embodiment.

Referring to FIG. 2A, a first masking block 100 is disposed and pressed on a growth substrate 200. The first masking block 100 may be substantially same as the masking block previously explained with reference to FIGS. 1A to 1C. For example, the first masking block 100 may include an h-BN thin film 30 with a thickness of a mono-layer or a bi-layer, which is formed on a gamma-alumina thin film 22. The first masking block 100 contacts the growth substrate 200 such that the h-BN thin film 30 contacts a surface of the growth substrate 200.

The h-BN thin film 30 may be physically adhered to the growth substrate 200 thereby forming a contact interface.

The growth substrate 200 may include a bulk material. The bulk material may be defined by a material, which does not have a two-dimensional structure. For example, the bulk material may include an oxide, a nitride or a metal. In an exemplary embodiment, the bulk material may include an oxide such as silica, alumina or the like.

The first masking block 100 includes the h-BN thin film 30 contacting the growth substrate 200. The h-BN thin film 30 does not have dangling bonds. Thus, it may be prevented that a chemical bonding is formed between the first masking block 100 and the growth substrate 200 in a synthetic process performed at a high temperature. Thus, the first masking block 100 may be easily debonded or detached from the growth substrate 200 after a two-dimensional material is synthesized between the first masking block 100 and the growth substrate 200.

Furthermore, the first masking block 100 has a low surface roughness, and the gamma-alumina thin film 22 has a large surface potential. Since the h-BN thin film 30 covering the gamma-alumina thin film 22 has a small thickness, which may be a mono-layer level or a bi-layer level, a field by the surface potential of the gamma-alumina thin film 22 may be transferred to the growth substrate 200. Thus, an adhesion force between the first masking block 100 and the growth substrate 200, and slip between the first masking block 100 and the growth substrate 200 may be prevented when the two-dimensional material is synthesized between the first masking block 100 and the growth substrate 200.

The first masking block 100 may have a suitable design to partially contact the growth substrate 200. For example, the first masking block 100 may have a protrusion or an opening.

Figure 2B:
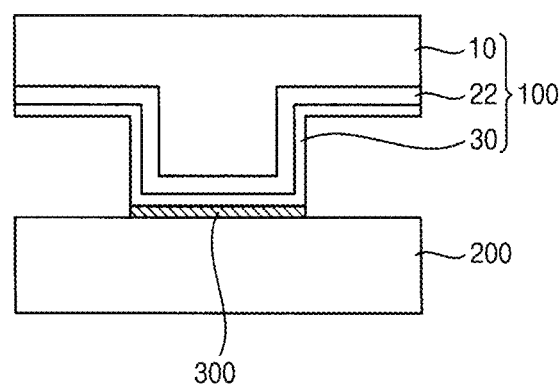

Referring to FIG. 2B, a graphene thin film pattern 300 is formed selectively at a contact interface of the growth substrate 200 and the h-BN thin film 30.

For example, the growth substrate 200 bonded with the first masking block 100 may be disposed in a chamber, and a CVD process may be performed for synthesizing graphene. Hydrocarbons such as methane, ethane or the like may be provided as a carbon source for synthesizing graphene. In an exemplary embodiment, methane gas may be used for a carbon source. Furthermore, a processing gas for the synthesizing process may include an oxygen-containing material such as oxygen gas, $H_2O$ or the like. The oxygen gas may be provided by leakage of a synthetic system or may be individually provided as a processing gas.

The carbon source may be dehydrogenated by heat or a catalyst to form a source atom (a carbon atom). For example, the graphene thin film pattern 300 may be formed at 800° C. to 1,200° C. When a chamber temperature is excessively low, a synthesizing speed may be excessively low, or graphene may be hardly synthesized.

When a synthetic condition may include a suitable catalyst, for example, the growth substrate 200 may include a gamma-alumina thin film, the graphene thin film pattern 300 may be formed at a lower temperature, for example, 150° C. to 800° C.

Atoms or molecules are diffused according to interfacial diffusion between the h-BN thin film 30 and the growth substrate 200. Diffusivity of the atoms or the molecules according to interfacial diffusion may be varied drastically depending kinds of the atoms and the molecules. For example, diffusivity according to interfacial diffusion may be calculated as the following:

$$D \approx v_0 \exp\left(\frac{-E_d}{k_B T}\right)$$

$v_0$: n-th order vibrational frequency, (mostly $10^{13}$/s)
$E_d$: interfacial diffusion barrier
$k_B$: Boltzmann constant ($8.62 \times 10^{-5}$ eV/K)
T: absolute temperature (K)

According to the above, a ratio of diffusivities of carbon atoms and oxygen molecules is at least 20,000. Thus, affection of impurities such as oxygen molecules may be minimized in the process of synthesizing graphene. Therefore, graphene having inhibited defects may be obtained.

Furthermore, oxygen molecules (or oxygen atoms) may easily react with carbon atoms at an area where the growth substrate 200 is not bonded to the h-BN thin film 30.

Accordingly, graphene is not synthesized at an area where the growth substrate 200 is exposed. For example, combustion reaction of the carbon atoms with a growth inhibitor such as oxygen molecules is predominant to graphitization reaction. Thus, the graphene thin film pattern 300 is formed selectively between the h-BN thin film 30 and the growth substrate 200.

For example, a concentration of the growth inhibitor, which is a volume ratio to the carbon source, may be equal to or more than $1/10^6$ so that combustion reaction may be predominant at the interface-excluding area (the exposed area). The concentration of the growth inhibitor, which satisfies the condition, may be varied depending on a process temperature. For example, the concentration of the growth inhibitor to the carbon source may be equal to or more than $1/10^5$ at 800° C. to 1,200° C. In an exemplary embodiment, the concentration of the growth inhibitor to the carbon source may be equal to or more than $1/10^4$ to further promote the combustion reaction in the interface-excluding area. The concentration of the growth inhibitor may be a concentration of molecules, and a concentration of oxygen atoms generated from the growth inhibitor to the carbon atoms from the carbon source may be different from the concentration of molecules. For example, the concentration of the oxygen atoms to the carbon atoms may be equal to or more than $1/10^3$.

When graphene is synthesized in a condition including the growth inhibitor such as oxygen, the interface between the growth substrate 200 and the h-BN thin film 30 function as a diffusion barrier against the growth inhibitor. Thus, the graphene thin film pattern 300 may be selectively formed at the interface of the growth substrate 200 and the h-BN thin film 30.

Accordingly, as selectivity of synthesizing graphene is increased, the graphene thin film pattern 300 may be obtained without an additional patterning process.

According to exemplary embodiments, the graphene thin film pattern 300 may be formed by bonding the first masking block 100 to the growth substrate 200. The first masking block 100 may have an increased adhesion force to the growth substrate 200. Thus, slip between the first masking block 100 and the growth substrate 200 may be prevented when the graphene thin film pattern 300 is formed between the first masking block 100 and the growth substrate 200.

Figure 2C:
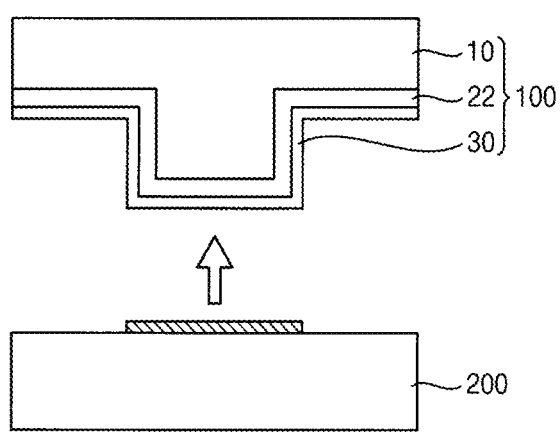

Referring to FIG. 2C, the first masking block 100 is debonded or detached from the growth substrate 200. The first masking block 100 does not form a chemical bonding with the growth substrate 200 or the graphene thin film pattern 300. Furthermore, an adhesion force between the growth substrate 200 and the graphene thin film pattern 300 may be larger than an adhesion force between the h-BN thin film 30 and the graphene thin film pattern 300. Thus, the first masking block 100 may be easily debonded or detached from the growth substrate 200.

Figure 2D:
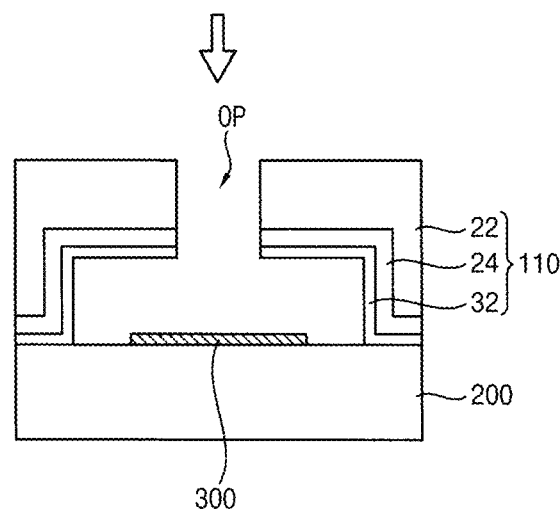

Referring to FIG. 2D, a second masking block 110 is disposed and pressed on the growth substrate 200. The second masking block 110 may contact a portion of the growth substrate 200 and may be spaced apart from the graphene thin film pattern 300. For example, the second masking block 110 may include a protrusion contacting the growth substrate 200.

The second masking block 110 may include an h-BN thin film 32 with a thickness of a mono-layer or a bi-layer, which is formed on a gamma-alumina thin film 24. The second masking block 110 contacts the growth substrate 200 such that the h-BN thin film 32 contacts a surface of the growth substrate 200. The h-BN thin film 32 may be physically adhered to the growth substrate 200 thereby forming a contact interface.

In an exemplary embodiment, the second masking block 110 may include an opening OP to provide a processing gas to a growth area therethough. The opening OP may connect a space surrounded by the second masking block 110 to an external space along a vertical direction or a horizontal direction.

Figure 2E:
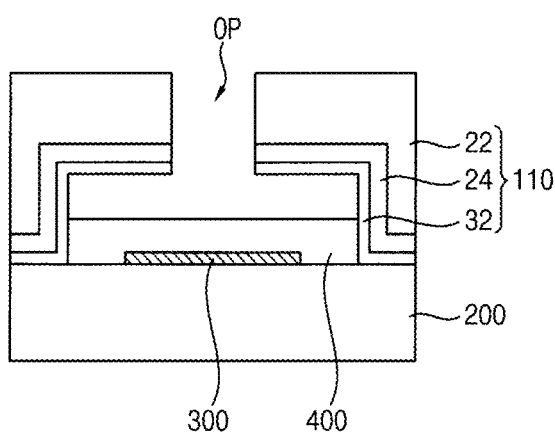

Referring to FIG. 2E, a pattern is formed on an area, which is not covered by the second masking block 200. In an exemplary embodiment, the pattern may be an h-BN thin film pattern 400. However, exemplary embodiments are not limited thereto. For example, the pattern may include other two-dimensional material such as a transitional metal dichalcogenide than h-BN. For example, the transitional metal dichalcogenide may include molybdenum sulfide, molybdenum selenide, tungsten sulfide, tungsten selenide, titanium selenide or a combination thereof. Furthermore, the pattern may include an insulation material or a dielectric material such as silicon oxide, silicon nitride, a metal oxide or the like.

The h-BN thin film pattern 400 may cover the graphene thin film pattern 300 to function as an insulation layer a dielectric layer.

As explained in the above, borazine may be used as a source for forming the h-BN thin film 400. The growth substrate 200 is physically adhered to the second masking block 110 thereby forming a barrier against a source gas. Thus, the source gas (borazine) is not provided between the growth substrate 200 and the second masking block 110. Thus, the h-BN thin film pattern 400 may be formed selectively on an exposed upper surface of the growth substrate 200 and on the graphene thin film pattern 300.

Figure 2F:
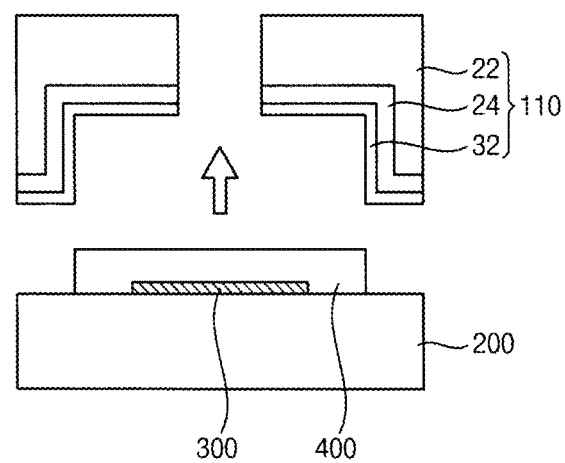

Referring to FIG. 2F, the second masking block 110 is debonded or detached from the growth substrate 200. The second masking block 110 does not form a chemical bonding with the growth substrate 200 or the h-BN thin film pattern 400 when the h-BN thin film pattern 400 is synthesized. Thus, the second masking block 110 may be easily debonded or detached from the growth substrate 200.

The first masking block 100 and the second masking block 110 may be reused for forming other patterns.

In an exemplary embodiment, the h-BN thin film pattern 400 covers the graphene thin film pattern 300. However, exemplary embodiments are not limited thereto. For example, an h-BN thin film pattern may be solely formed, or an h-BN thin film pattern may have various shapes or arrangements.

According to exemplary embodiments, a masking block having a hybrid configuration of gamma-alumina and h-BN is used for directly synthesizing a pattern of a two-dimensional material. Thus, slip of the masking block may be prevented, and the masking block may be stably bonded to a growth substrate in the process of synthesizing the pattern. Thus, it may be prevented that the pattern is transcribed or moved and that the pattern or the growth substrate is damaged. Thus, reliability of directly synthesizing a pattern of a two-dimensional material may be remarkably improved.

Hereinafter, effects of exemplary embodiments will be explained with reference to particular examples and experiments.

Example 1

Manufacturing a Masking Block

An $SiO_2$/Si substrate with a size of 10 mm×10 mm was prepared and cleaned through mega-sonication with 20 W to 25 W to remove particles generated in dicing.

40 ml of $H_2O_2$ (30%) and 40 ml of $H_2SO_4$ (95%) were mixed to prepare a Piranha solution and maintained for 30 seconds to remove bubbles. The $SiO_2$/Si substrate was cleaned by the Piranha solution for 10 minutes, and each of dies was further cleaned through mega-sonication for 1 minute and dried by a nitrogen-gun to prepare a base substrate.

An alumina ($Al_2O_3$) thin film was formed on the base substrate at 150° C. in an ALD reactor and cleaned through mega-sonication.

The base substrate was ramped up to 400° C. over 15 minutes, and heated in vacuum at 400° C. for 30 minutes to remove amorphous carbon. Thereafter, the base substrate was ramped up to 1,050° C. and heated in vacuum for 30 minutes to form a gamma-alumina thin film with a high quality.

The base substrate with the gamma-alumina thin film was put in a CVD system and ramped up to 700° C. 20 sccm of $N_2$ was provided on the base substrate with a small amount of $CH_4$ and 1,000 sccm of $H_2$ through a canister with −10° C. to form an h-BN thin film thereby manufacturing a masking block.

Figure 3A:
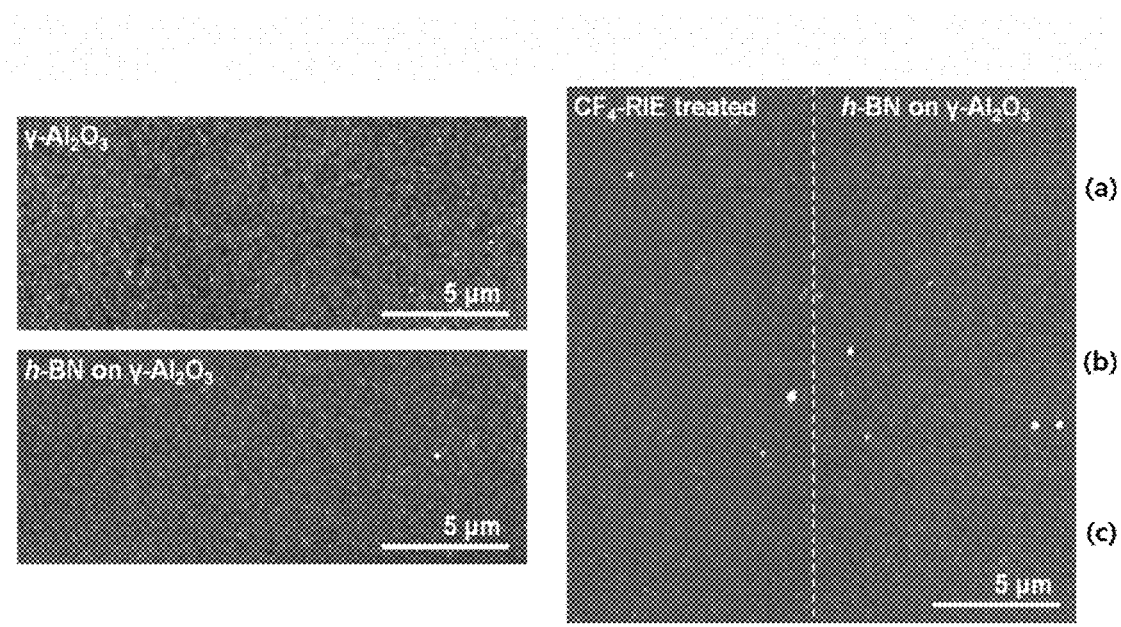
FIG. 3A is an image of an atomic force microscopy (AFM) showing a surface of the masking block manufactured according to Example 1.
Figure 3B:
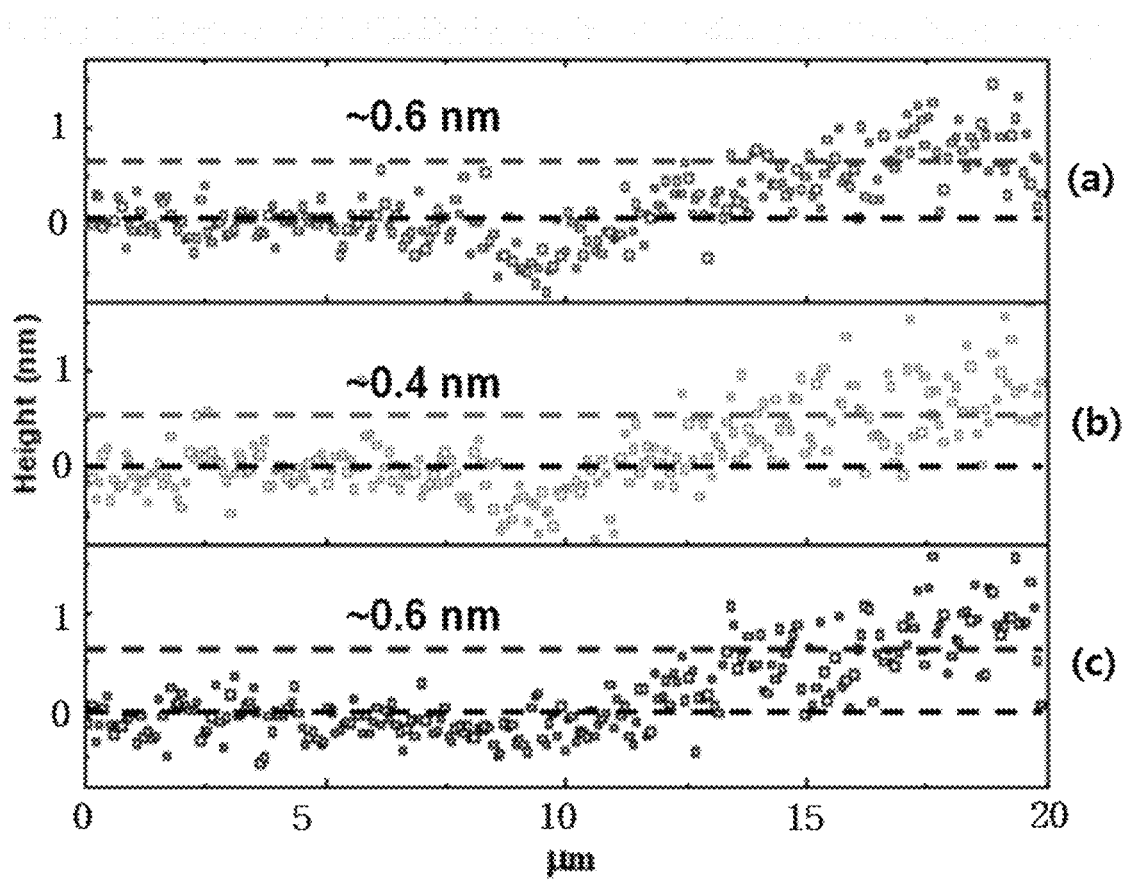
FIG. 3B is a graph showing a result of measuring a surface height of the masking block manufactured according to Example 1.

FIG. 3A is an image of an atomic force microscopy (AFM) showing a surface of the masking block manufactured according to Example 1. FIG. 3B is a graph showing a result of measuring a surface height of the masking block manufactured according to Example 1. In order to measure a thickness of the h-BN thin film, the h-BN thin film was partially removed by reactive ion etching (RIE) using $CH_4$, and a height difference was measured.

Referring to FIG. 3A, a morphology of a surface of the gamma-alumina thin film is very similar to a morphology of a surface of the h-BN thin film. Thus, it can be noted that the h-BN thin film is synthesized along the surface of the gamma-alumina thin film. Furthermore, referring to FIG. 3B, it can be noted that the thickness of the h-BN thin film is 0.5 nm, which is a mono-layer level.

Figure 4:
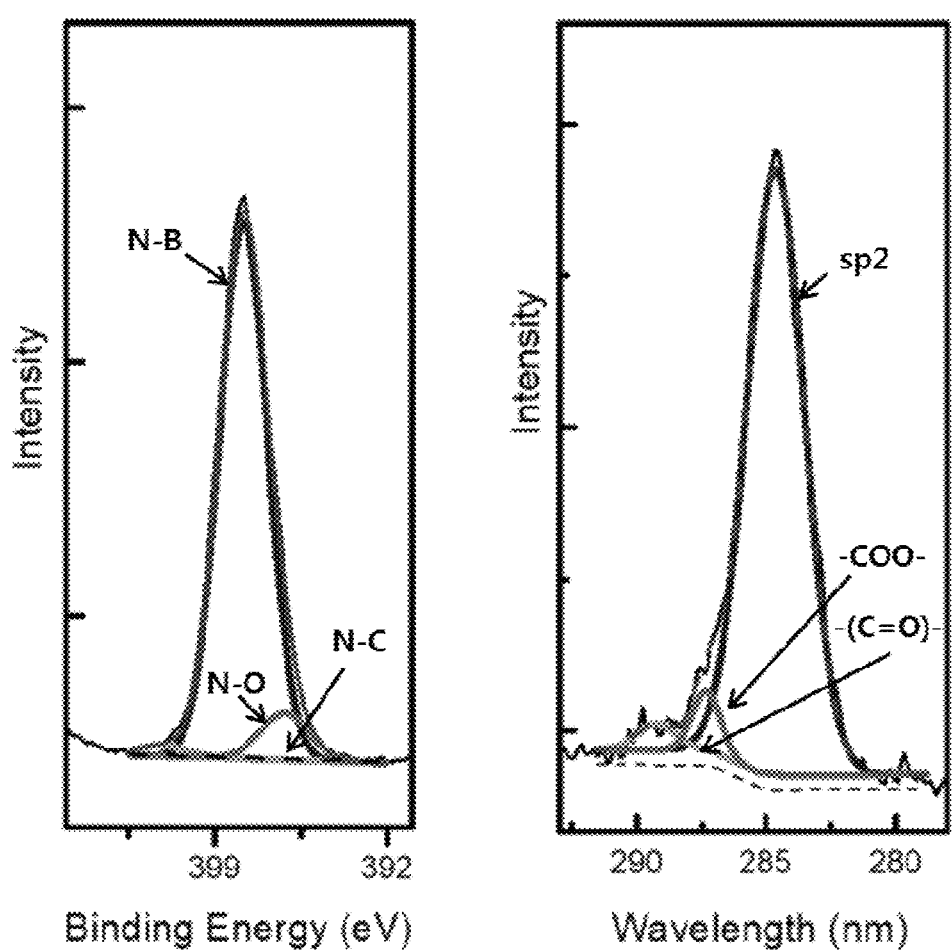
FIG. 4 is a graph showing XPS analysis results of the h-BN thin film of the masking block manufactured according to Example 1.

FIG. 4 is a graph showing XPS analysis results of the h-BN thin film of the masking block manufactured according to Example 1. Referring to the graph at a left side, which shows an N1s analysis result, it can be noted that a carbon amount in the h-BN thin film was about 7.9 at % and that an oxygen amount in the h-BN thin film was about 1.6 at %. Referring to the graph at a right side, which shows a C1s analysis result, it can be noted that an amount of sp2 bonds was about 93%, an amount of carboxyl groups about 4.5%, and an amount of ketone groups was about 2.7%.

Directly Forming a h-BN Pattern Using a Masking Block

The masking block of Example 1 was pressed and adhered to a growth substrate including $SiO_2$, and a CVD process was performed to synthesize h-BN. Particularly, the growth substrate with the masking block was ramped up to 400° C. over 15 minutes in an atmosphere including 1,000 sccm of $H_2$, and heated in vacuum without providing $H_2$ at 400° C. for 30 minutes to remove amorphous carbon. Thereafter, the growth substrate with the masking block was ramped up to 1,050° C. over 15 minutes in an atmosphere including 1,000 sccm of $H_2$, and 20 sccm of $N_2$ was provided through a canister with −10° C. for 6 and half minutes to form an h-BN thin film pattern.

Figure 5A:
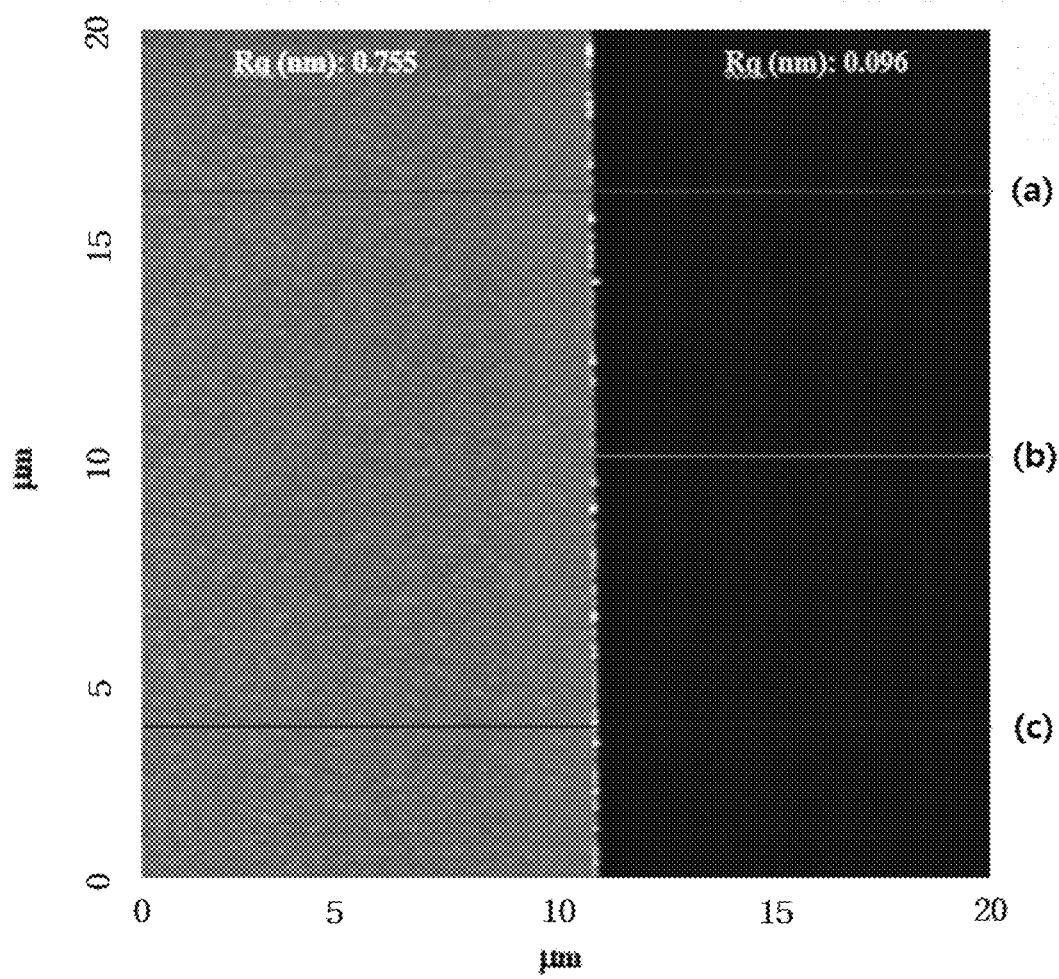
FIG. 5A is an image of an AFM showing the growth substrate and the h-BN thin film pattern directly formed on the growth substrate by using the masking block of Example 1.

FIG. 5A is an image of an AFM showing the growth substrate and the h-BN thin film pattern directly formed on the growth substrate by using the masking block of Example 1. FIG. 5B is a graph showing a result of measuring a surface height of the growth substrate and the h-BN thin film pattern directly formed on the growth substrate by using the masking block of Example 1. Referring to FIGS. 5A and 5B, an area (a left side) where the h-BN thin film pattern was formed can be clearly distinguished from an area (a right side) where h-BN thin film pattern was not formed. Thus, it can be noted that the masking block did not slip on the growth substrate while the h-BN thin film pattern was formed.

As Comparative Example 1, a masking block including a graphene thin film formed on an $SiO_2$ substrate was pressed and adhered to a growth substrate including $SiO_2$, and a CVD process was performed to synthesize h-BN.

Figure 6A:
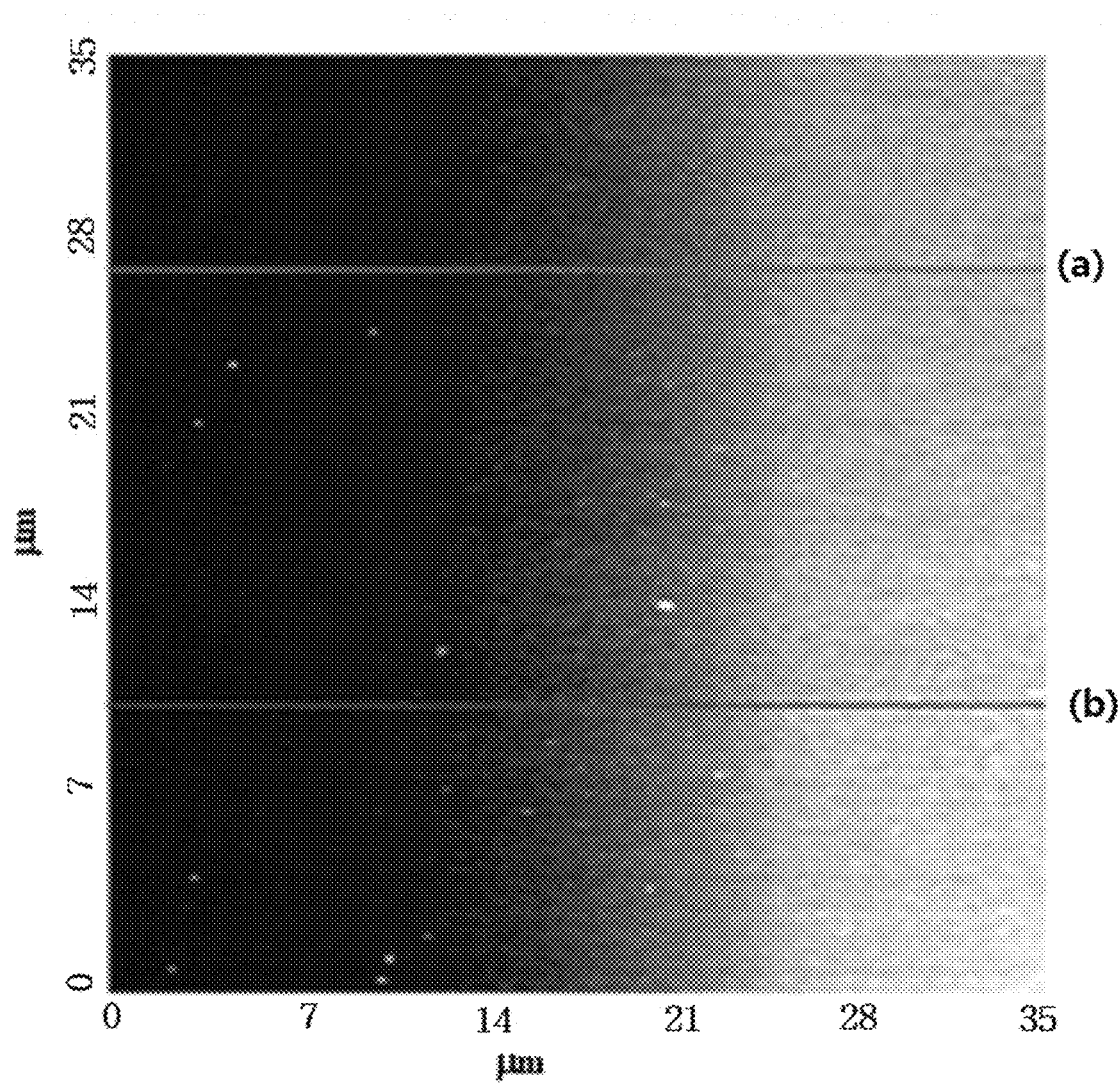
FIG. 6A is an image of an AFM showing the growth substrate and the h-BN thin film pattern directly formed on the growth substrate by using the masking block of Comparative Example 1.
Figure 6B:
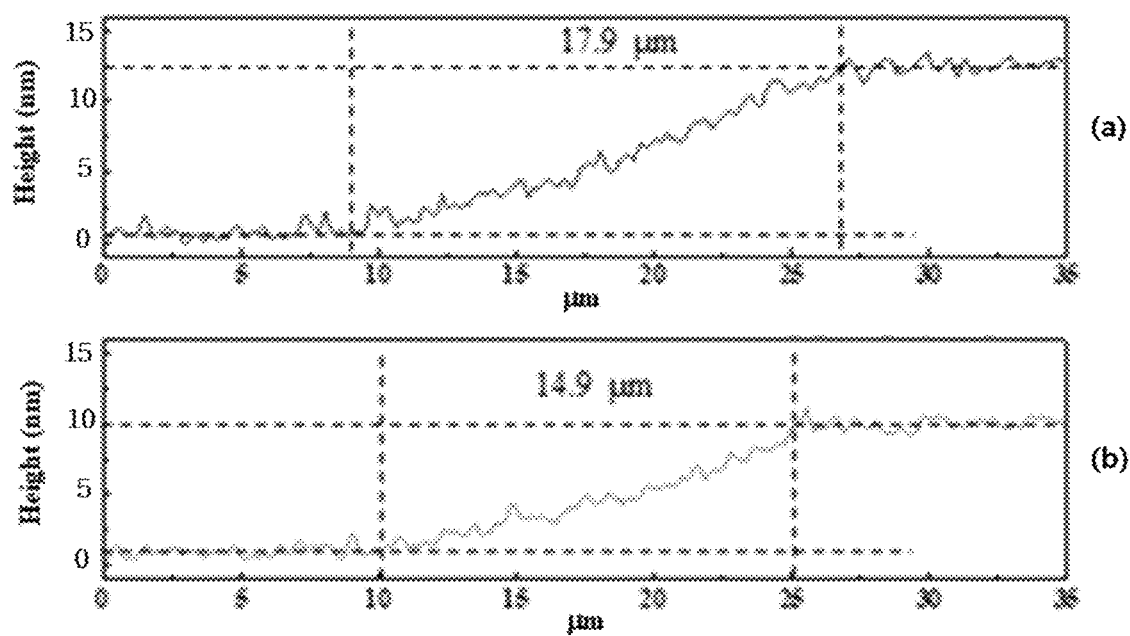
FIG. 6B is a graph showing a result of measuring a surface height of the growth substrate and the h-BN thin film pattern directly formed on the growth substrate by using the masking block of Comparative Example 1.

FIG. 6A is an image of an AFM showing the growth substrate and the h-BN thin film pattern directly formed on the growth substrate by using the masking block of Comparative Example 1. FIG. 6B is a graph showing a result of measuring a surface height of the growth substrate and the h-BN thin film pattern directly formed on the growth substrate by using the masking block of Comparative Example 1. Referring to FIGS. 6A and 6B, an area (a right side) where the h-BN thin film pattern was formed is not accurately distinguished from an area (a left side) where h-BN thin film pattern was not formed. Furthermore, referring to the height profile, it can be noted that the masking block slipped on the growth substrate while the h-BN thin film pattern was formed.

Exemplary embodiments of the present invention may be used for manufacturing various electronic elements including an electro-optical modulator, a switching element, a transistor, optical device or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A masking block configured to contact a growth substrate to define a pattern of a two-dimensional material directly synthesized on the growth substrate, the masking block comprising:
   a base substrate;
   a gamma-alumina film that is disposed on the base substrate and that has an upper surface in which a (110) plane is dominant as being more than 50%; and
   a hexagonal boron nitride film that is doped with carbon and oxygen, that is disposed on the gamma-alumina film,
   wherein the hexagonal boron nitride film contains an amount of carbon ranging from 1 at % to 15 at % based on total atoms of carbon, oxygen, nitrogen and boron in the hexagonal boron nitride film, and
   wherein the hexagonal boron nitride film includes voids such that a coverage ratio of the hexagonal boron nitride film on the gamma-alumina film is less than 1 and equal to or more than 0.9, and
   wherein the upper surface of the gamma-alumina film has a root mean square roughness of 1 nm or less.

2. The masking block of claim 1, wherein the hexagonal boron nitride film contains an amount of oxygen ranging from 1 at % to 10 at % based on the total atoms of carbon, oxygen, nitrogen and boron in the hexagonal boron nitride film.

3. The masking block of claim 1, wherein the hexagonal boron nitride film is a monolayer or a bilayer and has a thickness ranging up to and including 1 nm.

4. The masking block of claim 1, wherein the gamma-alumina film has a thickness ranging from 5 nm to 50 nm.

5. The masking block of claim 1, wherein the gamma-alumina film has a thickness ranging from 5 nm to 10 nm.

6. A method for forming a pattern, the method comprising:
   pressing the masking block of claim 1 on a growth substrate to adhere the masking block to the growth substrate;
   providing a source material to the growth substrate to form a pattern of a two-dimensional material; and
   debonding the masking block from the growth substrate.

7. The method of claim 6, wherein the two-dimensional material includes graphene, and the pattern is formed selectively at a contact interface between the masking block and the growth substrate.

8. The method of claim 7, wherein the pattern including graphene is synthesized in an atmosphere including a carbon source and an oxygen-containing material.

9. The method of claim 6, wherein the two-dimensional material includes hexagonal boron nitride or a transitional metal dichalcogenide, and the pattern is formed selectively on an exposed surface of the growth substrate, which is not adhered to the masking block.

10. A masking block configured to contact a growth substrate to define a pattern of a two-dimensional material directly synthesized on the growth substrate, the masking block comprising:
    a base substrate;
    a gamma-alumina film that is disposed on the base substrate and that has an upper surface in which a (110) plane is dominant as being more than 50%; and
    a hexagonal boron nitride film that is doped with carbon and oxygen, that is disposed on the gamma-alumina film,
    wherein the hexagonal boron nitride film contains an amount of carbon ranging from 1 at % to 15 at % based on total atoms of carbon, oxygen, nitrogen and boron in the hexagonal boron nitride film, and
    wherein the hexagonal boron nitride film includes voids such that a coverage ratio of the hexagonal boron nitride film on the gamma-alumina film is less than 1 and equal to or more than 0.9, and
    wherein the upper surface of the gamma-alumina film has an (111) plane, and wherein a sum of the (110) plane and the (111) plane in the upper surface of the gamma-alumina film is equal to or more than 99% thereof.

* * * * *